United States Patent [19]
Kim et al.

[11] Patent Number: 5,784,397
[45] Date of Patent: Jul. 21, 1998

[54] BULK SEMICONDUCTOR LASERS AT SUBMILLIMETER/FAR INFRARED WAVELENGTHS USING A REGULAR PERMANENT MAGNET

[75] Inventors: Jin J. Kim, Winter Springs; Robert E. Peale, Oviedo; Kijun Park, Orlando, all of Fla.

[73] Assignee: University of Central Florida, Orlando, Fla.

[21] Appl. No.: 558,440

[22] Filed: Nov. 16, 1995

[51] Int. Cl.$^6$ .................. H01S 3/18; H01S 3/30; H01S 3/00; H01S 3/083
[52] U.S. Cl. .................. 372/43; 372/4; 372/37; 372/66; 372/69; 372/94; 257/1
[58] Field of Search ............... 372/37, 4, 43, 372/66, 69, 81, 94; 257/1; 357/27; 417/50

[56] References Cited

U.S. PATENT DOCUMENTS

| | | | |
|---|---|---|---|
| 3,569,798 | 3/1971 | Amantea | 257/712 |
| 3,708,763 | 1/1973 | Paul | 359/156 |
| 3,841,107 | 10/1974 | Clark | 62/3.1 |
| 3,851,174 | 11/1974 | Tynan et al. | 250/336 |
| 3,978,417 | 8/1976 | Fletcher et al. | 372/37 |
| 4,194,168 | 3/1980 | Jarrett et al. | 372/94 |
| 4,344,302 | 8/1982 | Jarrett, Jr. et al. | 62/51.1 |
| 4,450,460 | 5/1984 | Morimoto | 250/338.1 |
| 4,614,930 | 9/1986 | Hickey et al. | 3358/302 |
| 4,739,287 | 4/1988 | Staupendahl et al. | 359/280 |
| 4,749,952 | 6/1988 | Morimoto | 359/344 |
| 4,806,885 | 2/1989 | Morimoto | 359/284 |
| 4,823,177 | 4/1989 | Prinz et al. | 257/421 |
| 4,879,722 | 11/1989 | Dixon et al. | 372/21 |
| 4,881,814 | 11/1989 | Hoult | 356/346 |
| 5,074,682 | 12/1991 | Uno et al. | 385/93 |
| 5,209,646 | 5/1993 | Smither | 417/50 |
| 5,314,547 | 5/1994 | Heremans et al. | 148/33.1 |

OTHER PUBLICATIONS

Gornik, "Tunable Far Infra-red Sources Based on Landau-Level Transitions", Optics and Laser Technology, vol. 7, No. 3, pp. 121–126, Jun. 1975.

Brown et al, "Characteristics of a Linearly Pumped Laser Oscillator–Amplifier at 496 um", Applied Physics Letters, vol. 28, No. 11, pp. 654–656, Jun. 1976.

(List continued on next page.)

*Primary Examiner*—Rodney B. Bovernick
*Assistant Examiner*—Quyen Phan
*Attorney, Agent, or Firm*—Brian S. Steinberger; Law Offices of Brian S. Steinberger

[57] ABSTRACT

A p-Ge laser operating at submillimeter wavelengths in Voigt configuration using a regular permanent magnet. The invention is improvement over prior art Ge Lasers which use superconducting magnets that require liquid helium to cool the magnets along with the Ge crystal. Although the subject invention requires cooling(refrigerant) of the Ge crystal itself, it does not need liquid helium. The permanent magnet can be $Nd_2Fe_{14}B$. The emissions using the novel invention were observed over a wider range of electric-field magnitude in Voigt configuration at a given magnetic field as compared to that of the prior system. The free space beam profile of the subject invention is Gaussian. The emission-strength of the subject invention is sufficient between 4 and 10K that a closed-cycle refrigerator can be used to cool the crystal rather than the liquid helium used in all prior p-Ge lasers. The open architecture of the permanent magnet facilitates use of cooling fins/heat sinks, which are demonstrated to increase repetition rate and energy output over all prior p-Ge lasers, which do not use such. Since permanent magnets can be cut to any shape and are not restricted to solenoid geometries, novel laser configurations including ring lasers and oscillator/amplifiers can be realized in contrast to prior p-Ge lasers, which are exclusively oscillators only.

18 Claims, 8 Drawing Sheets

OTHER PUBLICATIONS

Vorobjev et al., "Generation of Far–Infrared Radiation by Hot Holes in Germanium and Silicon in E_H Fields", Optical and Quantum Electronics, vol. 23, pp. S221–S229 (no month), 1991.

Hosako et al., "p–Type Ge Far–Infrared Laser Oscillation in Voigt Configuration", Semicond. Sci. Technol., vol. 7, pp. B645–B648, (no month), 1992.

Park et al., "Submm p–Ge Laser Using a Regular Permanent Magnet", OSA Proceedings on Advanced Solid–State Lasers, vol. 24, pp. 277–281 (no month), 1995.

Submillimeter P–Ge Laser Using a Voigt–Configured Permanent Magnet, Kijuyn Park, Robert E. Pea Weidner, Jin J. Kim, Submitted to IEEE Journal of Quantum Electronics for publication (no date available).

"Abstimmbarer p–Germanium–Einkristall–Laser Fur Den Wellenlangenbereich Von 70_M BIS 350 Tunable P–Germanium Monobrystal Laser for the Wavelength Region From 70_M to 350_M", E. Brundermann, et al., Laser und Optoelektronik, Nov. 1992, pp. 48–60.

"Far–Infrared Semiconductor Lasers", Optical and Quantum Electronics, 1991 Chapman and Hall, Ltd., E. Gornik and Professor A. A. Andronov.

Front View

Side View

BULK SEMICONDUCTOR LASERS AT SUBMILLIMETER/FAR INFRARED WAVELENGTHS USING A REGULAR PERMANENT MAGNET

This invention relates to semiconductor lasers emitting light at submillimeter/Far Infared wavelengths via intervalence band transitions, and in particular to a method and apparatus for generating the necessary magnetic field around the submillimeter/Far Infrared emitting semiconductor laser by using a novel arrangement of permanent magnet(s) instead of using a superconducting magnet.

BACKGROUND AND PRIOR ART

Practical applications have a need for lasers to operate in the sub-mm region(i.e. approximately the 30 to 300 micron ranges). Applications for such laser sources include plasma diagnostics, satellite communications, remote sensing, molecular and solid state spectroscopy, particle sizing, and laser velocimetry. However, few lasers operate in this FIR/ submillimeter wavelength region.

Although free electron lasers operate in the sub-mm region, they come with several problems. Free electron lasers are large and expensive and require extensive facilities and dedicated personnel to operate. The only solid state lasers known in this range are based on intervalence band transitions in p-type semiconductors, mostly Germanium (Ge).

Currently Ge lasers emit within the 70 to 250 micron wavelength range and have exclusively used superconducting magnets. Such magnets require immersion in liquid helium, which is expensive and requires specialized hardware and training to use.

Intervalence band lasing is based on population inversion between light and heavy hole bands. An electric field (E) accelerates holes in a perpendicular magnetic field (B). Population inversion is achieved when E/B is tuned to prevent light holes from reaching the threshold for inelastic optical photon scattering while allowing heavy holes to do so. Light holes remain "hot," while heavy holes scatter back to k=0, where some of them become light holes. The laser wavelength is tunable over the broad gain region in k-space by use of a selective resonator. See: Susumu Komiyama, Hiroshi Morita, and Iwao Hosako, "Continuous Wavelength Tuning of Inter-Valance-Band Laser Oscillation in p-type Germanium Over Range of 80-120 mm," Jpn. J. Appl. Phys., vol. 32, pp. 4987–4991, 1993; A. V. Murav'ev, I. M. Nefedov, S. G. Pavlov, and V. N. Shastin, "Tunable narrow-band laser that operates on interband transitions of hot holes in germanium," Quantum Electron., vol. 23, pp. 119–124, 1993; L. E. Vorobjev, S. N. Danilov, D. V. Donetskil, Yu. V. Kochegarov, V. I. Stafeev, and D. A. Firsov, "Noninjection narrow-band laser emitting far-infrared radiation due to hot holes and its use in impurity breakdown investigations," Semiconductors, vol. 27, pp. 77–82, 1993; and A. A. Andronov, V. A. Kozlov, S. A. Pavlov, and S. G. Pavlov, "External Bragg selection in a hot-hole germanium semiconductor laser," Sov. J. Quantum Electron., vol. 20, pp. 1211–1213, 1990.

SUMMARY OF THE INVENTION

The first objective of the present invention is to provide an intervalence band semiconductor laser that emits wavelengths within approximately 70 to approximately 250 micron range without using superconductor magnets.

The second objective of this invention is to provide an intervalence band semiconductor laser that emits wavelengths within approximately 70 to approximately 250 micron ranges without using liquid helium. See FIG. 1A.

The third objective of this invention is to provide an intervalence band semiconductor laser that emitts wavelengths within approximately 70 to approximately 250 micron ranges using permanent magnets. See FIGS. 1A, 1B, and 2. FIG. 4 shows a spectrum of laser emission using a permanent magnet p-Ge laser with lines at 200 µm. The inset of FIG. 4 shows the measured gaussian profile of the laser beam.

The fourth objective of this invention is to provide an easier way of achieving the Voigt geometry than can be realized with traditional super conducting solenoids. The Voigt geometry results in higher emission intensities and a broader range of electric and magnetic fields for which lasing can be obtained than does Faraday geometry. The Voigt geometry holds when the propagation vector of the beam, K, is perpendicular to the applied magnetic-field vector B. See FIGS. 1A, 1B.

The fifth objective of this invention is to facilitate novel laser configurations using permanent magnets of any desired geometry which could not easily be achieved with super conducting magnets. See FIGS. 8 and 9.

Further objects and advantages of this invention will be apparent from the following detailed description of a presently preferred embodiment which is illustrated schematically in the accompanying drawings.

DESCRIPTION OF THE PREFERRED EMBODIMENT

Figure 1A:
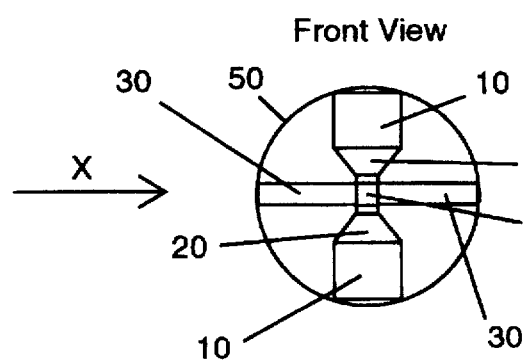
FIG. 1A. is a front view schematic of the invention. Shown is a Ge laser with a Voigt configured permanent magnet. For the this front view, the directions of the magnetic- and electric-fields applied to the sample and the propagation vector of the emission are shown.
Figure 1A:
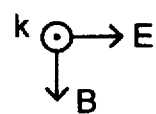

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

For the present demonstration a 4.1×4.3×51 mm p-Ge rod with Ga concentration of NA–ND $9\times10^{13}$ cm$^{-3}$ (~33 ohm-cm) was cut out of a crystal grown by Eagle-Picher. It was placed between the poles of a permanent magnet or within a superconducting solenoid. The crystal was uniquely oriented so that B∥[001] and light propagation k∥[110] for Voigt geometry and B∥k∥[110] for Faraday geometry. Electric pulses (~150 A, ~300 V) of ~2 µs (2 microsec) duration were applied at 1 to 180 Hz through indium Ohmic contacts on the [1–10] faces (4.3×51 mm$^2$) using a high-power electric pulse generator, such as the one described in Kijun Park and Jin J. Kim, "A High Power Current Pulse Generator Using an Insulated-Gate Bipolar Transistor," Rev. Sci. Instrum., vol. 66, pp. 3713–3714, 1995.

The electric field magnitudes were determined from the applied voltage divided by the distance between the Ohmic contacts. The end surfaces of the Ge rod were polished parallel to better than 1 arc-min as tested using HeNe laser reflections. We used a polished copper back mirror. A copper mirror with a 1.5-mm-diam hole or a 33.9-µm period Cu mesh (8.6-µm thick wire) was used as the output coupler to complete the non-selective resonator. Both mirrors were insulated by 25 µm thick low-density polyethylene film to prevent electric discharge through them. Each magnet was attached to an insert for a variable temperature (2~300K) cryostat with ZnSe inner windows and high-density-polyethylene (HDPE) outer windows. Radiation was collected by a gold-coated off-axis ellipsoidal mirror and focused onto a Si-composite bolometer, equipped with either a 27 µm or 100 µm long pass filter, or a Ge:Ga photoconductor cooled to 4K. The detector signal was processed by an oscilloscope and a digitizing camera. The light-path from the sample cryostat to the detector cryostat was evacuated to 0.1 Torr to prevent absorption by water vapor. The temperature was determined using a calibrated Allen Bradley 1-kW carbon resistor mounted directly in contact with the Ge crystal.

FIG. 1 A. is a schematic of the invention of a Ge laser with a Voigt configured permanent magnet. FIG. 113 is side view schematic of the invention of FIG. 1A. The components of which will now be discussed. Referring to FIG. 1A and 1B, elements labelled 10 are the permanent magnets which can be formed from $Nd_2 Fe_{14} B$, and are used to apply a magnetic field to the semiconductor rod Element 40. Elements 20 are iron pole faces for concentrating the magnetic field in the crystal. Elements 30 are cooling fins, or alternatively thermal ballast, or alternatively cold fingers of a closed cycle refrigerator. They are made of Cu or other materials with high thermal conductivity. Element 35 is part of the closed cycle refrigerator, which can be used instead of liquid helium(as shown as 252 in FIG. 2), to cool Element 40 below 10K through a cold finger (Element 30). Element 40 is the semiconductor active gain medium which can be a rod of p-Ge(Germanium). Element 50 is an iron yoke for concentrating the magnetic field. The operation of the components of FIGS. 1A–1B will now be described.

Figure 1B:
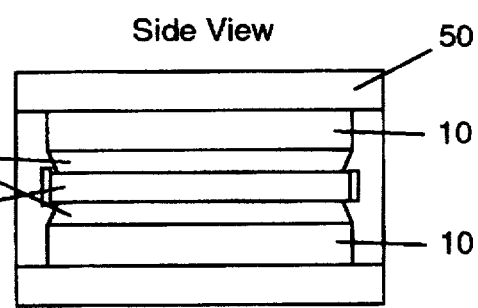
FIG. 1B is side view schematic of the invention of FIG. 1A along arrow E, along with electric field direction E, the magnetic field direction B, and the beam propagation direction k.
Figure 1B:
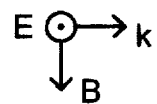

Reierring to FIGS. 1A and 1B, Voigt configuration holds when the B-field is perpendicular to the direction of the light emitted. In Faraday configuration, the light propagation and magnetic field are parallel. For the top view, the directions of the magnetic-and electric-fields applied to the sample and the propagation vector of the emission are shown. The magnets 10 are made of 35-MG-Oe sintered $Nd_2Fe_{14}B$ alloy.

The yoke 50 and the poles 20, made of soft iron, are designed to concentrate magnetic flux through the Ge rod 40. The magnetic field is generally uniform. The Ge rod 40 is placed between the magnet poles, with the output coupler 45 on the bottom, so that the propagation of emission (k) is perpendicular to the magnetic field B(Voigt geometry). In contrast, when the superconducting solenoid of the prior art is used, the magnetic field is parallel to k (Faraday geometry). In both cases polished brass mirror(not shown) are used to reflect the emission horizontally out of the cryostat chamber.

Figure 2:
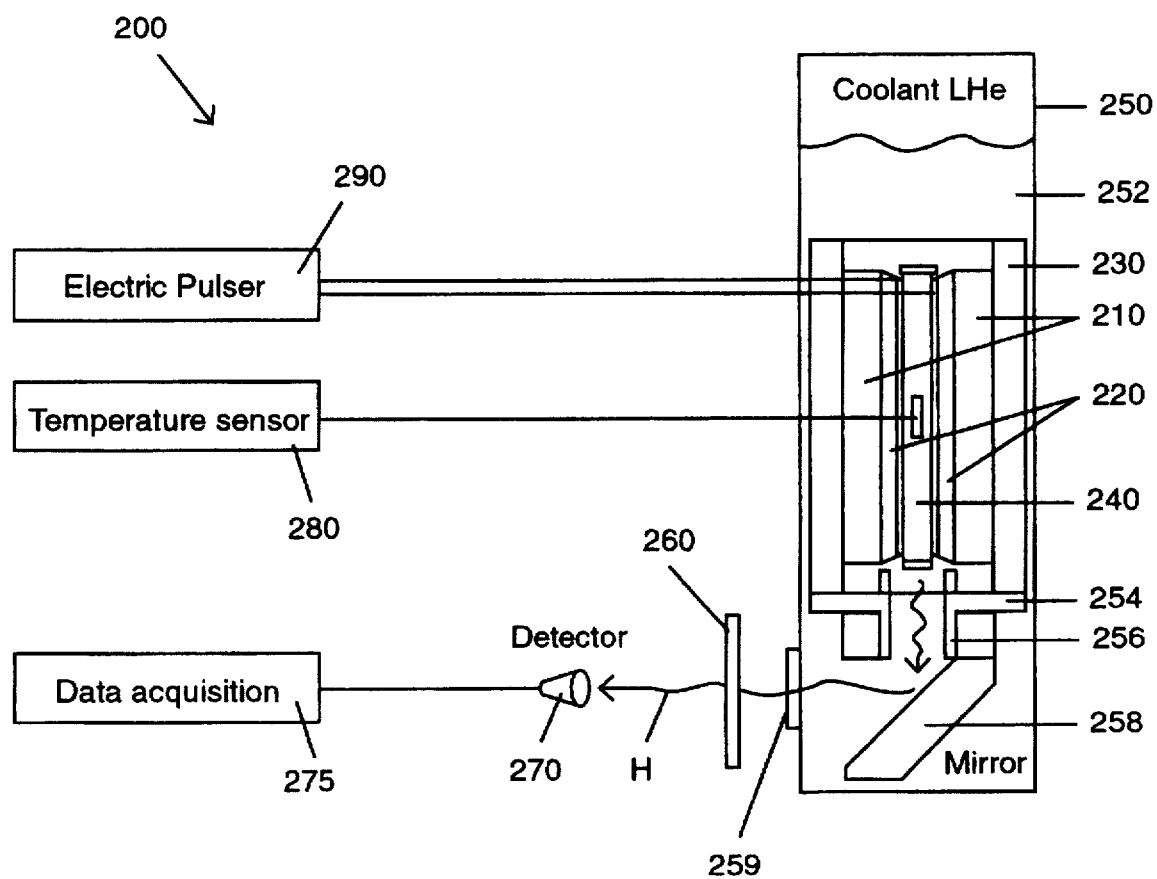
FIG. 2 is an experimental set-up using the novel Ge laser with the Voigt configured permanent magnet configuration of FIG. 1A.

FIG. 2 is an experimental set-up 200 using the novel Ge laser with a Voigt configured permanent magnet configuration of FIGS. 1A and 1B. The components of FIG. 2 will now be described. Elements labelled 210 are the permanent magnets (corresponding to Elements 10 of FIG. 1A–1B).

Elements 220 are pole faces (corresponding to Elements 20 of FIGS. 1A–1B). Element 230 is the magnet yoke (corresponding to Element 50 of FIGS. 1A–1B). Element 240 is the semiconductor rod (corresponding to Element 40 of FIGS. 1A–1B). Component 250 is the inner bore of a liquid helium cryostat. Element 252 represents a liquid helium bath which cools Element 240. Components 254 and 256 are an adapter support for attaching Element 258 to Element 130. Element 258 is a mirror reflector for directing the laser beam horizontally out of bore 250 through elements 259 and 260. Element 259 is a window such as but not limited to Zn Se, and the like, which is transparent to the laser beam when cooled. Element 260 is the outer window of the cryostat. Window 260 can be chosen from a material transparent to the laser beam at room temperature such as but not limited to high intensity polyethylene, and the like. 270 is detector for radiation at the wave length of the laser beam, H, which can include a submillimeter/far-infared wavelength of approximately 30 to approximately 400 microns. Element 275 represents electronic apparatus necessary to amplify, average and record the signal from Element 270, and can include a IBM compatible 486 multimedia computer with a digital storage oscilloscope manufactured by Tektronix or Hewlett Packard, Inc. Resistance meter 280 reads the resistance off of an Allen Bradley resistor 285(1K ohms at 300 Kelvin(room temperature)). The resistance meter 280 measures the calibrated temperature dependent resistance of resistor 285 which corresponds to the temperature of the rod 240. Component 290 is an electric field pulser is a standard high-power electric pulse generator, such as the one described in Kijun Park and Jin J. Kim, "A High Power Current Pulse Generator Using an Insulated-Gate Bipolar Transistor," Rev. Sci. Instrum., vol. 66, pp. 3713–3714, 1995. Pulser 290 can have a pulse duration of 1–5 µs, a voltage range 100–1000 V, with a current of approximately 0–200 A. Near its peak, the emission easily saturates the pre-amplifiers of the bolometer/photoconductor (refer to Element 270) and the photoconductor so that the signal has to be taken directly at the detector-element output before the preamps. Both intensity and the width of the E, B ranges are very sensitive to alignment of the cavity mirrors. This is a evidence of laser oscillation.

Figure 3:
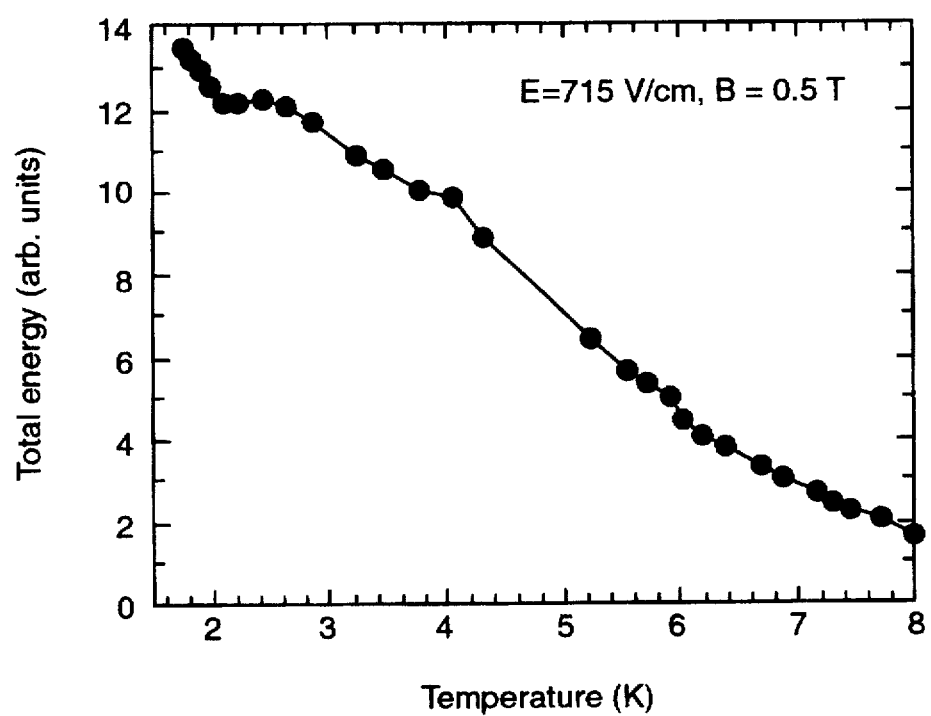
FIG. 3 is a graph of the temperature dependence of total energy output of laser pulse.

FIG. 3 shows the temperature dependence of total energy output. The data shows that cooling the sample using a closed cycle refrigerator or other method is a feasible option. Liquid Helium is unnecessary. Pulse signals are taken from data stored by Element 275. The points are obtained by integrating time-dependent pulse signals.

Figure 4:
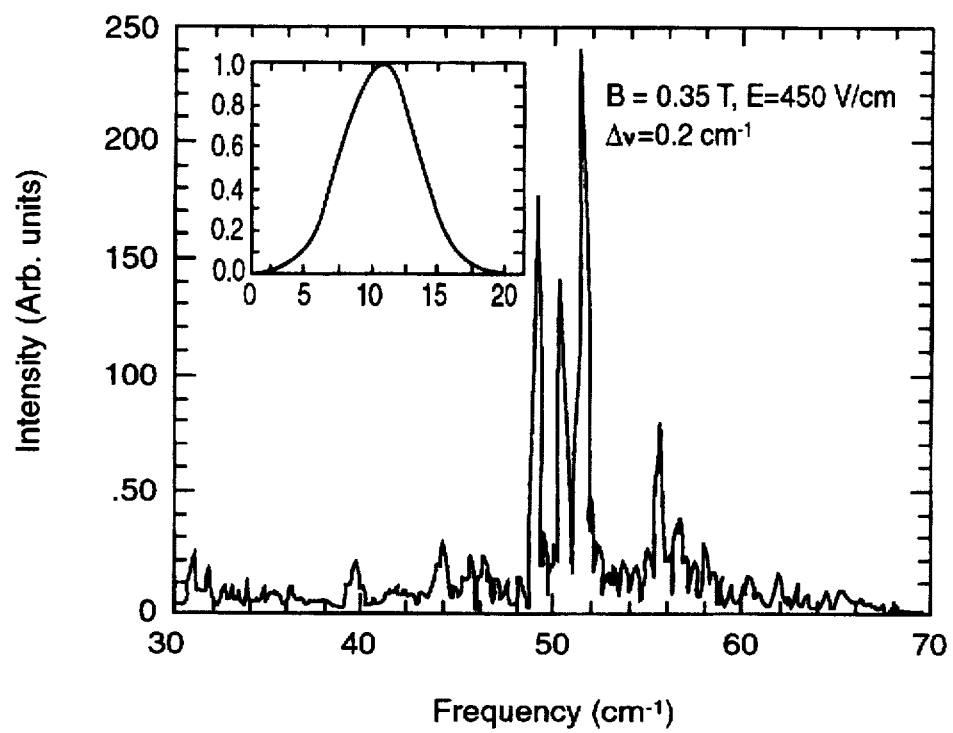
FIG. 4 is a spectrum of multimode laser output new 200 mm (200 micron) wavelengths using the Voigt configured permanent magnet. Inset shows the measured Gaussian beam profile.

FIG. 4 is a multimode spectrum of laser output near 200 µm using Voigt configured permanent magnet. Inset shows the measured Gaussian beam profile. FIG. 4 is further evidence of laser action in the permanent-magnet p-Ge laser since it shows sharp emission lines (less than 0.2 cm$^{-1}$ line width) with a well defined mode structure. The 1.2 cm$^{-1}$ separation is explained as transverse modes for 3 mode oblique reflections inside the crystal. The Gaussian beam profile is further evidence of laser action.

Figure 5:
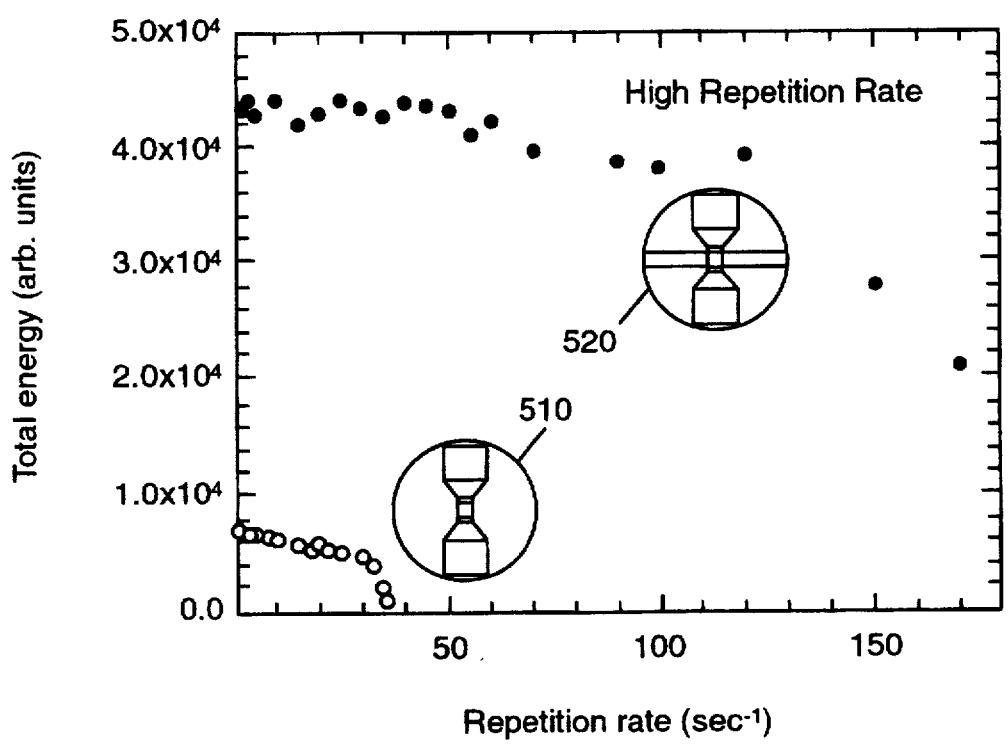
FIG. 5 compares output intensity versus repetition rate for a Voigt geometry, permanent-magnet p-Ge laser at 4K with and without cooling fins.

Referring to FIG. 5, component 510 is the front view of a permanent magnet p-Ge laser without cooling fins. (See FIG. 1A). Element 520 is the front view of a permanent magnet p-Ge laser with cooling fins. (See FIG. 1A). FIG. 5 compares emission strength versus repetition rates for the permanent magnet with (Element 520) and without (Element 510) cooling fins attached to the semiconductor active medium (Element 40 and 140). FIG. 5 shows a tremendous advantage gained by using cooling fins in contact with the semi conductor gain medium in terms of total pulse energy and repetition rate. Because of its open architecture relative to super conducting solenoids, the permanent magnet facilitates the use of cooling fins.

Figure 6:
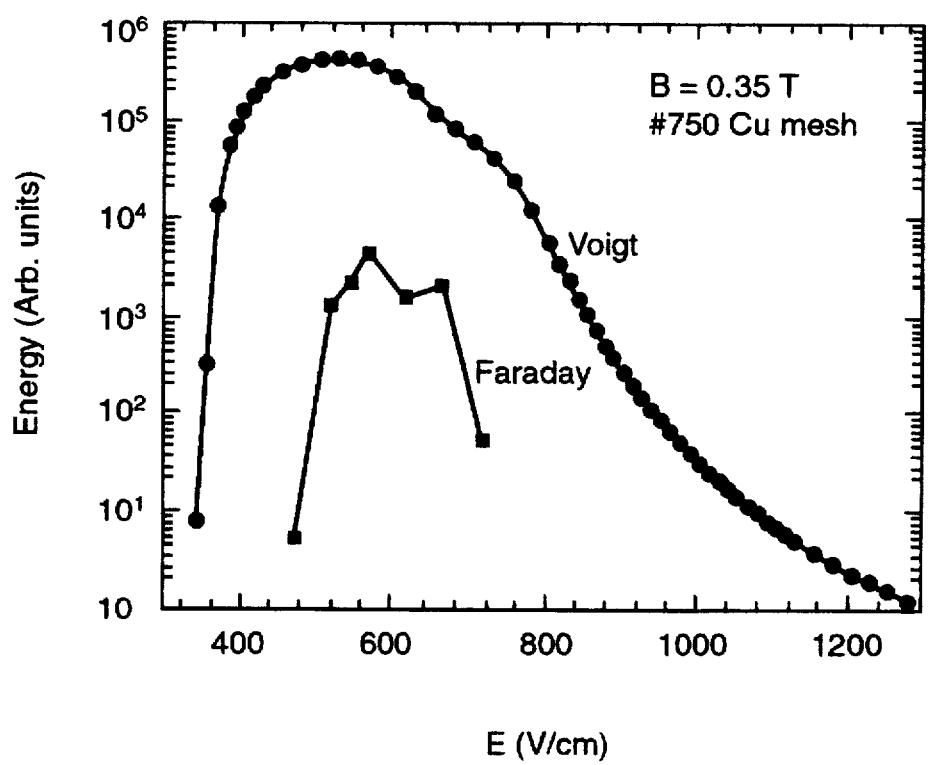
FIG. 6 compares output intensity as a function of electric field for fixed magnetic field for a p-Ge laser in Faraday configuration using a superconducting magnet and in Voigt configured using permanent magnet.

FIG. 6 shows output intensity as a function of electric field for fixed magnetic field for a p-Ge laser in Faraday configuration using a superconducting magnet and in Voigt configuration using permanent magnet. The Voigt configuration using a permanent magnet is advantageous in terms of total pulse energy output and electric-field range.

Figure 7:
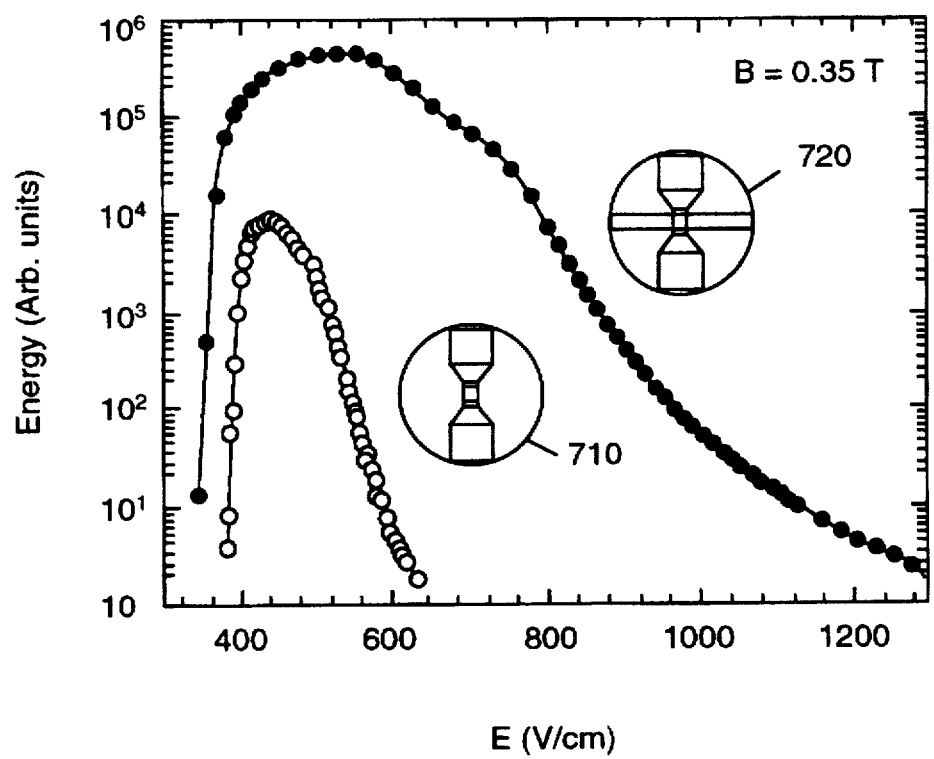
FIG. 7 shows the effect of cooling bars on output energy and E-fold range and electric-field range.

FIG. 7 shows the effect of cooling bars on output energy and electric-field range. Elements 710 and 720 corresponds to elements 510 and 520, respectively of FIG. 5. Cooling bars significantly reduce the negative effects of Joule heating during the electric-field pulse. Much more total energy can be obtained from the laser, which can also be operated at higher electric field values. The wider electric-field range is an advantage because for some values of magnetic field, higher electric fields are necessary to achieve maximum gain. Cooling bars are facilitated by the open architecture achievable with permanent magnets.

Figure 8:
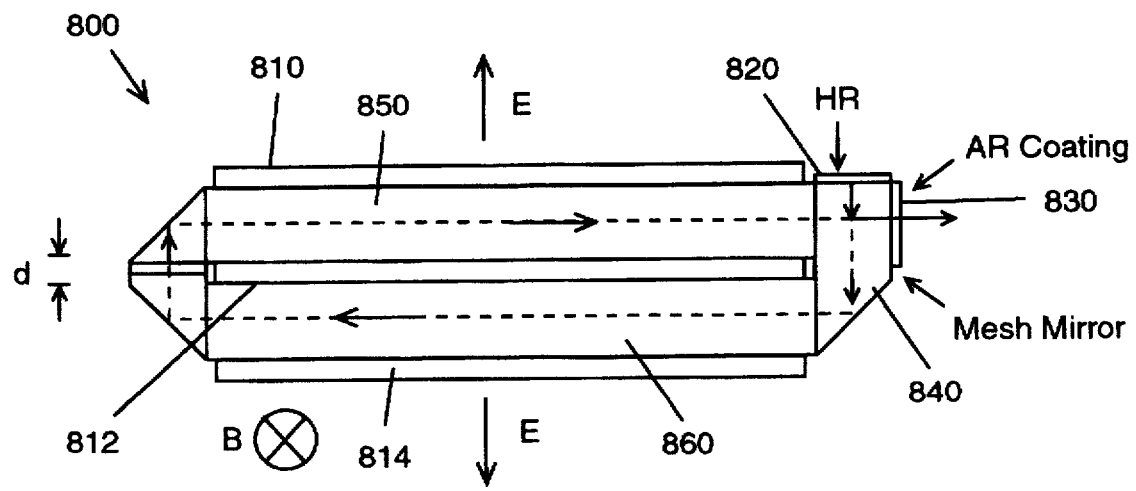
FIG. 8 shows a design for a p-Ge ring laser, one of several novel configurations facilitated by using permanent magnets instead of super conducting coils.

FIG. 8 shows a configuration 800 for a semiconductor FIR/sub-mm ring laser. The components and operation of FIG. 8 will now be described. Elements 810 and 814 are ground electric contacts attached to the semi conductor active medium Elements 850 and 860. Element 812 is the high voltage contact sandwiched between the two semiconductor rods Elements 850 and 860. Current is intended to flow from Element 812 to Element 810 through Element 850, and from Element 812 to Element 814 through Element 860. Component 820 is a high reflecting mirror intended to enhance clockwise propagation of the beam within the semi conductor medium. Component 830 is an anti-reflection coating to reduce back reflection of the beam in the counter-clockwise direction. Component 825 is a mesh output coupler sandwiched between the semi conductor prism Element 830 and semiconductor prism 840. The purpose of Element 825 is to extract part of the clockwise propagation beam. Component 835 is a semi conductor prism which holds Elements 820, 825, 830 in the desired position. 840 is a semi conductor prism intended to redirect radiation emerging from Element 850 and cause it to pass through Element 860. Components 850 and 860 are the active gain media. A magnetic field is applied perpendicular to the plane of the figure using permanent magnets (not shown) above and below Elements 850 and 860. Components 870 are semi conductor prisms having the same purpose as Element 840 and having the additional feature of an adjustable gap of width, d, intended to serve as an etalon tuning element. The arrows E show the direction of the applied pulsed electric field within elements 850 and 860. The cross within a circle indicates that a magnetic field B exists within elements 850 and 860 which is perpendicular to the plane of the Figure and directed into the page. The internal arrows within Elements 850, 860, 840 and 810 show the preferred unidirectional travelling wave needed to take advantage of the ring architecture.

Figure 9:
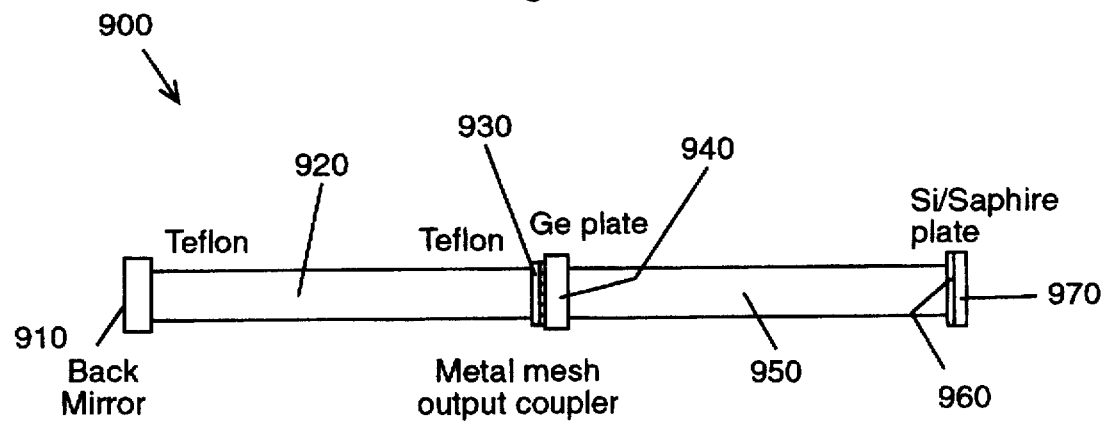
FIG. 9 shows a p-Ge laser with oscillator and amplifier stages, a configuration made possible because permanent magnets can be made arbitrarily long without a significant cost increase.

FIG. 9 shows a FIR/sub-mm semi conductor laser 900 with oscillator(elements 910, 920, 930) and amplifier (950). The components and operation of FIG. 9 will now be described. Element 910 is a 100% reflecting back mirror for the oscillator. Element 920 is the semiconductor active gain medium of the oscillator. Electric and magnetic fields are applied to Element 920. Element 930 is the metal mesh output coupler of the oscillator. Element 940 is a Ge plate to separate the oscillator (Elements 910, 920, 930) from the amplifier (Elements 950, 960, 970). Element 950 is a semi-conductor rod designed to amplify the laser beam from the oscillator (Elements 910, 920, 930) when electric and magnetic fields are applied to Element 950. Element 960 is a Si plate. Element 970 is a sapphire plate, which together with Element 960 serves as an anti reflection coating for Element 950 in order to suppress independent laser oscillation within the amplifier rod Element 950. Because the permanent magnets achieve sufficient field uniformity without being longer than the active medium (see FIG. 1B) long laser configurations such as shown in FIG. 9 are facilitated. In contrast, the traditional super conducting solenoid of the prior art systems must be at least three times longer than the semiconductor crystal in order to achieve sufficient magnetic-field uniformity.

While the permanent magnets described in the embodiments are formed from $Nd_2Fe_{14}B$, the permanent magnets can be formed from other magnetic materials such as but not limited to SmCo, Alnico, and the like. Although the embodiments describe the laser source as a rod of pGe (Germanium), the semiconductor crystal can alternatively be a rod of p-Si(Silicon), a rod of pGaAs (Gallium Arsenide), and the like.

Although p-type semi conductor crystals have been described, the invention will alternatively work with other materials such as but not limited to Diamond, SiC, AlAs, BN, BP, GaN, GaSb, GaP, InSb, InAs, InP, CdS, CdSe, CdTe, ZnO, ZnS, PbS, PbTe, and the like.

Although permanent magnets have been described, the invention will work with other permanent magnets whose separation can be changed to change the magnetic field strength inside the semi conductor gain medium. Further, the invention will work with hybrid magnets comprised of permanent magnets to establish the base field and electro magnets (super conducting or normal) to super impose an additional field such that the resultant magnetic field can be changed by changing the current in the electromagnet.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A semiconductor laser system, based on intervalence band or Landau level transitions, for operating in the sub-millimeter and Far Infrared wavelength range without utilizing a superconductor magnet, and without utilizing a Faraday configuration, the laser system comprising:

a p-type semiconductor crystal;

a first permanent magnet adjacent to one side of the semiconductor crystal;

a second permanent magnet adjacent to a second side of the semiconductor crystal opposite the first permanent magnet, the first and the second permanent magnet in a non Faraday configuration forming a magnetic field about the semiconductor crystal; and cooling means for conducting thermal energy away from the magnetic field, wherein applying a voltage perpendicular to the magnetic field causes the semiconductor crystal to emit in the submillimeter and far-infared wavelength region which includes a wavelength range of approximately 30 through approximately 400 microns.

2. The semiconductor laser system of claim 1, wherein the first permanent magnet and the second permanent magnet are formed from:

$Nd_2Fe_{14}B$.

3. The semiconductor laser system of claim 1, wherein the first permanent magnet and the second permanent magnet are formed from:

SmCo.

4. The semiconductor laser system of claim 1, wherein the first permanent magnet and the second permanent magnet are formed from:

Alnico.

5. The semiconductor laser system of claim 1, further comprising:

yoke and poles formed by a ferromagnetic material for concentrating magnetic flux through the semiconductor crystal.

6. The semiconductor laser system of claim 5, wherein the yoke and poles are formed from:

iron.

7. The semiconductor laser system of claim 1, wherein the semiconductor crystal includes:

a rod of p-Ge(Germanium).

8. The semiconductor laser system of claim 1, wherein the semiconductor crystal includes:

a rod of p-Si(Silicon).

9. The semiconductor laser system of claim 1, wherein the semiconductor crystal includes:

a rod of p-GaAs(Gallium Arsenide).

10. The semiconductor laser system of claim 1, wherein the first permanent magnet and the second permanent magnet comprise:

a Voigt configuration.

11. The semiconductor laser system of claim 1, wherein the first permanent magnet and the second permanent magnet include:

a ring laser configuration.

12. The semiconductor laser system of claim 1, wherein the first permanent magnet and the second permanent magnet include:

an oscillator and amplifier configuration.

13. The semiconductor laser system of claim 1, wherein the cooling means includes:

a closed cycle refrigerator for cooling the semiconductor crystal.

14. The semiconductor laser system of claim 1, wherein the cooling means includes:

LHe(liquid helium) as a coolant for the semiconductor crystal.

15. The semiconductor laser system of claim 1, wherein the cooling means includes:

a metallic heat sink for reducing joule heating effects.

16. The semiconductor laser system of claim 1, wherein the cooling means includes:

a cold finger for cooling the semi conductor gain medium through an external refrigerator.

17. The semiconductor laser system of claim 1, wherein the cooling means includes:

cooling fins for reducing joule heating effects.

18. A semiconductor laser system having a p-type Ge(Germanium) crystal, for operating in the submillimeter and Far Infrared wavelength range by generating a magnetic field for intervalence bands without utilizing a superconductor magnet, and without utilizing a Faraday configuration, the laser system comprising:

a p-type Ge(Germanium) crystal;

a first permanent magnet adjacent to one side of the Ge(Germanium) crystal;

a second permanent magnet adjacent to a second side of the Ge(Germanium) crystal opposite the first permanent magnet, the first and the second permanent magnet formed from $Nd_2Fe_{14}B$, the first and the second permanent magnet in a non Faraday configuration forming a magnetic field about the Ge(Germanium) crystal; and cooling means for conducting thermal energy away from the magnetic field, wherein applying a voltage perpendicular to the magnetic field causes the Ge(Germanium) crystal to emit in the submillimeter and far-infared wavelength region which includes a wavelength range of approximately 30 through approximately 400 microns.

* * * * *